(12) United States Patent
Rehner et al.

(10) Patent No.: US 10,168,399 B2
(45) Date of Patent: Jan. 1, 2019

(54) MR FIELD PROBES WITH ADDITIONAL WINDINGS FOR IMPROVING THE HOMOGENEITY AND LOCALIZING THE MEASURING VOLUME

(71) Applicants: Robert Rehner, Neunkirchen am Brand (DE); Markus Vester, Nürnberg (DE)

(72) Inventors: Robert Rehner, Neunkirchen am Brand (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 386 days.

(21) Appl. No.: 14/997,071

(22) Filed: Jan. 15, 2016

(65) Prior Publication Data

US 2016/0216346 A1     Jul. 28, 2016

(30) Foreign Application Priority Data

Jan. 22, 2015   (DE) .................. 10 2015 201 023

(51) Int. Cl.
| G01R 33/24 | (2006.01) |
| G01R 33/422 | (2006.01) |
| G01R 33/58 | (2006.01) |
| G01R 33/34 | (2006.01) |
| G01R 33/565 | (2006.01) |

(52) U.S. Cl.
CPC ........... *G01R 33/24* (2013.01); *G01R 33/422* (2013.01); *G01R 33/58* (2013.01); *G01R 33/34053* (2013.01); *G01R 33/56563* (2013.01)

(58) Field of Classification Search
CPC ...... G01R 33/24; G01R 33/422; G01R 33/58; G01R 33/34053; G01R 33/56563

USPC .................................................. 324/300–322
See application file for complete search history.

(56) References Cited

U.S. PATENT DOCUMENTS

| 3,795,855 | A | * | 3/1974 | Browning | G01N 24/08 |
| | | | | | 324/322 |
| 4,675,607 | A | * | 6/1987 | Golker | H05K 5/00 |
| | | | | | 324/247 |
| 5,539,315 | A | * | 7/1996 | Cory | G01R 33/34053 |
| | | | | | 324/314 |
| 6,002,253 | A | * | 12/1999 | Bornhofft | G01R 33/028 |
| | | | | | 324/258 |
| 6,087,832 | A | * | 7/2000 | Doty | G01R 33/343 |
| | | | | | 324/318 |

(Continued)

FOREIGN PATENT DOCUMENTS

DE         10314215 B4   11/2006

OTHER PUBLICATIONS

Barmet et al., A Transmit/Receive System for Magnetic Field Monitoring in Vivo MRI, Magnetic Resonance in Medicine, 62: 269-276 (2009).*

(Continued)

*Primary Examiner* — Patrick Assouad
*Assistant Examiner* — Sean Curtis
(74) *Attorney, Agent, or Firm* — Lempia Summerfield Katz LLC

(57) ABSTRACT

The embodiments relate to a method and field probes for measuring a static and/or in particular a dynamic magnetic field in an imaging magnetic resonance tomography system, wherein the field probe includes a body surrounded by a coil. The coil includes a middle or center winding section and at least one or two outer winding sections.

26 Claims, 3 Drawing Sheets

(56) References Cited

U.S. PATENT DOCUMENTS

| | | | |
|---|---|---|---|
| 6,828,791 B2* | 12/2004 | Morita | G01R 33/30 324/318 |
| 6,924,644 B2* | 8/2005 | Suits | G01V 3/105 324/309 |
| 7,084,634 B2* | 8/2006 | Morita | G01R 33/30 324/318 |
| 7,138,802 B2* | 11/2006 | Morita | G01R 33/30 324/318 |
| 7,446,534 B2* | 11/2008 | Withers | G01R 33/34069 324/318 |
| 7,701,217 B2* | 4/2010 | Withers | G01R 33/3628 324/318 |
| 8,093,899 B2* | 1/2012 | Barmet | G01R 33/24 324/318 |
| 8,106,657 B2* | 1/2012 | Sakellariou | G01R 33/307 324/307 |
| 8,547,110 B2* | 10/2013 | Kesil | G01N 27/023 324/633 |
| 9,372,246 B2* | 6/2016 | Miki | G01R 33/307 |
| 9,423,479 B2* | 8/2016 | Overweg | G01R 33/481 |
| 9,482,728 B2* | 11/2016 | Bottomley | G01R 33/285 |
| 2002/0130661 A1* | 9/2002 | Raftery | G01R 33/307 324/318 |
| 2003/0076103 A1* | 4/2003 | Okada | G01R 33/34046 324/321 |
| 2003/0173967 A1* | 9/2003 | Gerald, II | G01R 33/343 324/322 |
| 2005/0057251 A1* | 3/2005 | Suits | G01V 3/105 324/318 |
| 2005/0127914 A1* | 6/2005 | Eberler | G01R 33/34046 324/318 |
| 2008/0150536 A1* | 6/2008 | Withers | G01R 33/34069 324/322 |
| 2010/0033184 A1* | 2/2010 | Withers | G01R 33/34053 324/318 |
| 2010/0156414 A1* | 6/2010 | Sakellariou | G01R 33/307 324/309 |
| 2016/0216346 A1* | 7/2016 | Rehner | G01R 33/24 |

OTHER PUBLICATIONS

Gross et al., Dynamic Nuclear Magnetic Resonance Field Sensing with Part-Per-Trillion Resolution, www.nature.com/naturecommunications, Dec. 2, 2016.*

Coffey et al., A Large Volume Double Channel H-X RF Probe for Hyperpolarized Magnetic Resonance at 0.0475 Tesla., J Magn Reson, Jul. 2012.*

Barmet et al., A Transmit/Receive System for Magnetic Field Monitoring in Vivo MRI, Magnetic Resonance in Medicine, 62: 269-276 (2009) (Year: 2009).*

Gross et al., Dynamic Nuclear Magnetic Resonance Field Sensing with Part-Per-Trillion Resolution, www.nature.com/naturecommunications, (Dec. 2, 2016.) (Year: 2016).*

Coffey et al., A Large Volume Double Channel H-X RF Probe for Hyperpolarized Magnetic Resonance at 0.0475 Tesla., J Magn Reson, (Jul. 2012) (Year: 2012).*

Barment, C.: "Spatiotemporal Magnetic Field Monitoring for Magnetic Resonance Systems," in: Diss. ETH 17910, Swiss Federal Institute of Technology, pp. 1-175, Zurich, 2008.

Chu Ying-Hua et al: "Dynamic field monitoring by 20 channel field probes integrated with 11 channel head coil," in: Proc. Intl. Soc. Mag. Reson. Med., vol. 21, p. 668, 2013.

De Zanche, N., et.al.: "NMR Probes for Measuring Magnetic Fields and Field Dynamics in MR Systems," in: Magnetic Resonance in Medicine, vol. 60, pp. 176-186, 2008.

German Office action for related German Application No. 10 2015 201 023.6, dated Oct. 12, 2015, with English Translation.

Sipilä et al: "2H Transmit-Receive NMR Probes for Magnetic Field Monitoring in MRI," in: Mag. Reson. Med., vol. 6, pp. 1498-1506, 2011.

Tountcheva, V., et.al.: "A 64 channel receive-only field camera for eddy current and trajectory calibration," in: Proc. Intl. Soc. Mag. Reson. Med., vol. 20, p. 701, 2012.

* cited by examiner

MR FIELD PROBES WITH ADDITIONAL WINDINGS FOR IMPROVING THE HOMOGENEITY AND LOCALIZING THE MEASURING VOLUME

This application claims the benefit of DE 10 2015 201 023.6, filed on Jan. 22, 2015, which is hereby incorporated by reference in its entirety.

TECHNICAL FIELD

The embodiments relate to a MRT field probe, a MRT having at least one field probe, and a method for using at least one field probe to measure a static and/or a dynamic magnetic field in an imaging magnetic resonance tomography system.

BACKGROUND

Magnetic resonance devices (MRTs) for examining objects or patients using magnetic resonance tomography are known, for example, from DE 103 14 215 B4.

Field probes are described for instance in the publications below, which, by reference, are each part of the extent of disclosure of this application and are incorporated by reference herein. One publication is "NMR-Probes for Measuring Magnetic Fields and Field Dynamics in MR Systems," Nicola De Zanche, Christoph Barmet, Jurek A. Nordmeyer-Massner, and Klaas P. Pruessmann, Magnetic Resonance in Medicine 60:176-186 (2008). A second publication is "A 64 channel receive-only field camera for eddy current and trajectory calibration," Veneta Tountcheva, Boris Keil, Thomas Witzel, Dylan Tisdall, Philipp Hoecht, and Lawrence L. Wald, Martinos Center for Biomedical Imaging, MGH, Harvard Medical School, Radiology, Charlestown, Mass., United States, Siemens Medical Solutions USA Inc., Charlestown, Mass., United States, Harvard-MIT, Div. of Health Science and Technology, Cambridge, Mass., United States, Proc. Intl. Soc. Mag. Reson. Med. 20 (2012). A third publication is C. Barmet, "Spatiotemporal Magnetic Field Monitoring for Magnetic Resonance Systems," 2008, Diss. ETH no. 17910.

BRIEF SUMMARY

The scope of the present invention is defined solely by the appended claims and is not affected to any degree by the statements within this summary. The present embodiments may obviate one or more of the drawbacks or limitations in the related art.

It is an object of the present embodiments to optimize a measurement of a static and/or a dynamic magnetic field in an imaging magnetic resonance tomography system. This object is achieved in each case by the features of the independent claims. Advantageous developments are specified in the subclaims and the description. The embodiments described herein may provide an efficiently optimized measurement of a static and/or a dynamic magnetic field in an imaging magnetic resonance tomography system.

BRIEF DESCRIPTION OF THE DRAWINGS

Further features and advantages of possible embodiments emerge from the description following of exemplary embodiments with reference to the drawing, in which.

DETAILED DESCRIPTION

Figure 3:
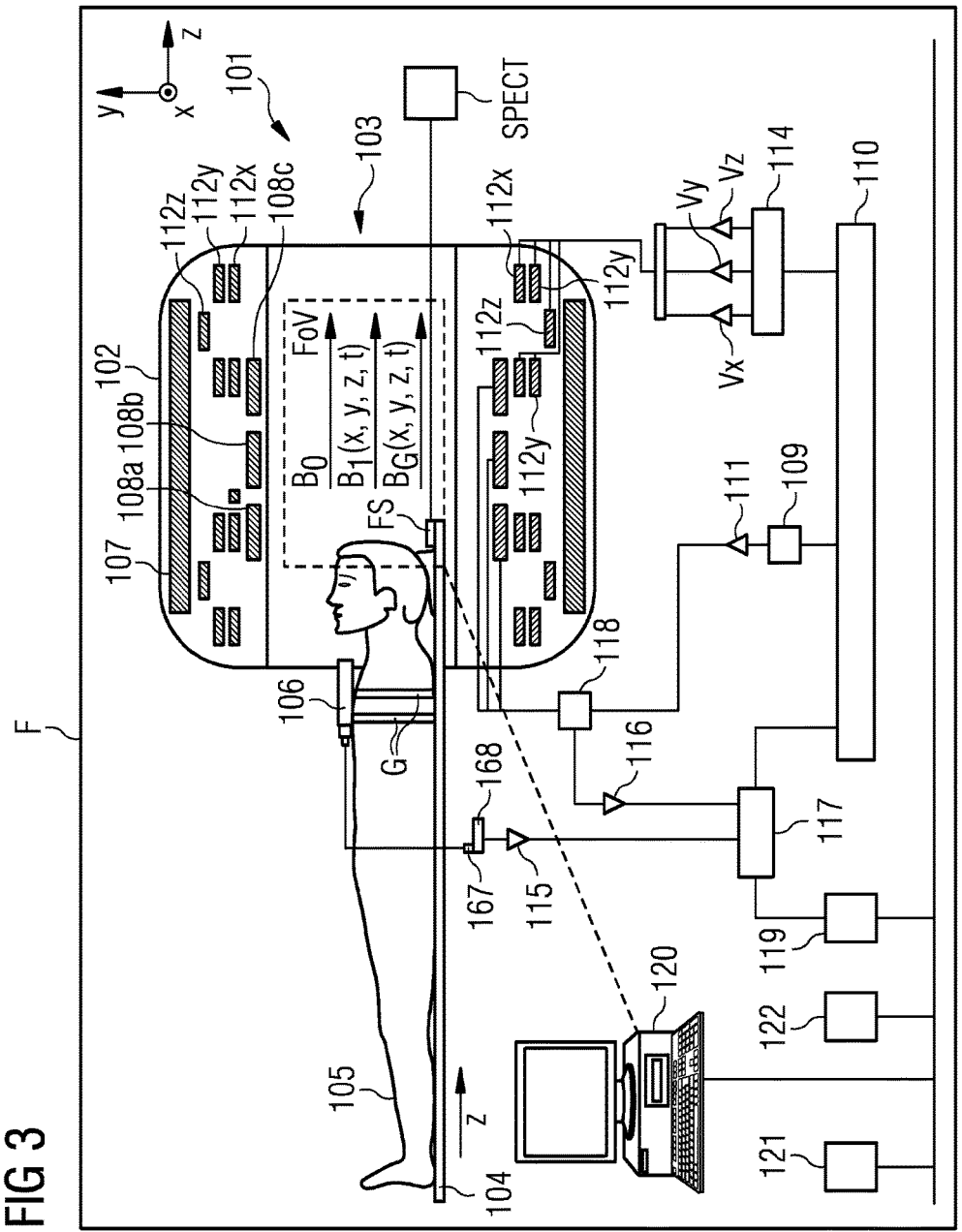
FIG. 3 schematically depicts an example of a MRT system.

FIG. 3 depicts an imaging magnetic resonance device MRT 101 (contained in a shielded room or Faraday cage F) with a hollow cylinder 102 having a tubular bore 103 into which a patient couch 104 bearing an examination object 105 (e.g., a body or a patient) (with or without local coil arrangement 106) may be introduced in the direction of the arrow z so that images of the patient 105 may be generated by an imaging method. Disposed on the patient 105 is a local coil arrangement 106, which may be used in a local region (also referred to as Field of View or FoV) of the MRT to generate images of a subregion of the body 105 in the FoV. Signals of the local coil arrangement 106 may be evaluated (e.g., converted into images, stored, or displayed) by an evaluation device (168, 115, 117, 119, 120, 121, etc.) of the MRT 101, which may be connected to the local coil arrangement 106, (e.g., via coaxial cable or wirelessly (167), etc.).

When a magnetic resonance device MRT 101 is used to examine a body 105 (e.g., an examination object or a patient) by magnetic resonance imaging, different magnetic fields coordinated with one another with the utmost precision in terms of their temporal and spatial characteristics are radiated onto the body 105. A strong magnet (e.g., a cryomagnet 107) in a measurement chamber having an in this case tunnel-shaped bore 103 generates a strong static main magnetic field $B_0$ ranging, for example, from 0.2 Tesla (T) to 3 Tesla or more. A body 105 to be examined, supported on a patient couch 104, is moved into a region of the main magnetic field $B_0$, which is approximately homogeneous in the area of observation FoV ("Field of View" or "field of view"). The nuclear spins of atomic nuclei of the body 105 are excited by way of magnetic radio-frequency excitation pulses $B_1$ (x, y, z, t) emitted via a radio-frequency antenna (and/or a local coil arrangement, if necessary) depicted here as a body coil 108 (e.g., multipart=108a, 108b, 108c). Radio-frequency excitation pulses are generated, e.g., by a pulse generation unit 109 controlled by a pulse sequence control unit 110. Following amplification by a radio-frequency amplifier 111, the pulses are directed to the radio-frequency antenna 108. The radio-frequency system depicted here is indicated only schematically. In certain examples, more than one pulse generation unit 109, more than one radio-frequency amplifier 111, and a plurality of radio-frequency antennas 108a, b, c are used in a magnetic resonance device 101.

The magnetic resonance device 101 also has gradient coils 112x, 112y, 112z by which magnetic gradient fields $B_G$ (x, y, z, t) are radiated in the course of a measurement in order to provoke selective layer excitation and for spatial encoding of the measurement signal. The gradient coils 112x, 112y, 112z are controlled by a gradient coil control unit 114 (and, if appropriate, by way of amplifiers Vx, Vy, Vz), which, like the pulse generation unit 109, is connected to the pulse sequence control unit 110.

Signals emitted by the excited nuclear spins (of the atomic nuclei in the examination object) are received by the body coil 108 and/or at least one local coil arrangement 106, amplified by assigned radio-frequency preamplifiers 116, and further processed and digitized by a receive unit 117. The recorded measurement data is digitized and stored in the form of complex numeric values in a k-space matrix. An associated MR image may be reconstructed from the value-filled k-space matrix by a multidimensional Fourier transform.

For a MRT coil that may be operated in both transmit and receive mode, (e.g., a body coil 108 or a local coil 106), correct signal forwarding is regulated by an upstream duplexer 118. From the measurement data, an image processing unit 119 generates an image that is displayed to a user via an operator console 120 and/or stored in a memory unit 121. A central computer unit 122 controls the individual system components.

In MR tomography as practiced today, images having a high signal-to-noise ratio (SNR) may be acquired by local coil arrangements (e.g., coils, local coils). These are antenna systems mounted in immediate proximity to the body 105 (e.g., on (anterior) or under (posterior) the body 105), on the body 105, or in the body 105. In the course of a MR measurement, the excited nuclei induce a voltage in the individual antennas of the local coil, which voltage is amplified by a low-noise preamplifier (e.g., LNA, preamp) and forwarded to the receive electronics. So-called high-field systems (e.g., 1.5 T-12 T or more) are used to improve the signal-to-noise ratio, even with high-resolution images. If more individual antennas may be connected to a MR receiving system than there are receivers present, a switching matrix (sometimes also called RCCS) is installed between receive antennas and receivers. The array routes the currently active receive channels (e.g., those currently lying in the magnet's field of view) to the receivers present. This enables more coil elements to be connected than there are receivers available, since in the case of whole-body coverage it is only necessary to read out those coils located in the FoV or, as the case may be, in the homogeneity volume of the magnet.

The term local coil arrangement 106 may describe, e.g., an antenna system that may include an antenna element or a plurality of antenna elements (e.g., coil elements) configured as an array coil. These individual antenna elements are embodied, for example, as loop antennas (loops), butterfly coils, flex coils, or saddle coils. A local coil arrangement includes, e.g., coil elements, a preamplifier, further electronics (e.g., standing wave traps, etc.), a housing, supports, and in certain examples, a cable with plug-type connector by which the local coil arrangement is connected to the MRT system. A receiver 168 mounted on the MRT system side filters and digitizes a signal received, (e.g., wirelessly, etc.), by a local coil 106 and passes the data to a digital signal processing device that, in certain cases, derives an image or a spectrum from the data acquired by a measurement and makes it available to the user, e.g., for subsequent diagnosis by him/her and/or for storage in a memory.

Figure 1:
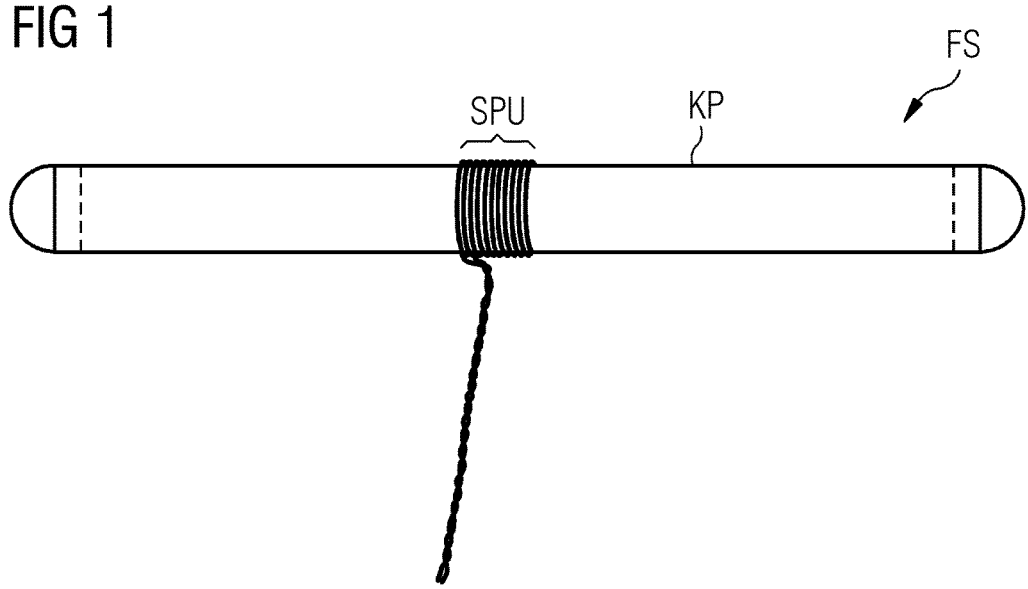
FIG. 1 depicts an example of a field probe.

FIG. 1 depicts a field probe FS for measuring a static and/or a dynamic magnetic field in an imaging magnetic resonance tomography system (e.g., the MRT 101 in FIG. 3), wherein the field probe FS has a body KP surrounded by a coil SPU.

In order to measure and adjust a static and/or dynamic magnetic field in a MRT system (e.g., the MRT 101 in FIG. 3), field probes based on nuclear resonance may be used. These field probes may include a small (e.g., approximately punctiform) volume filled with a signal-generating liquid (e.g., water or benzene) as a sample, which is surrounded by a coil SPU, HFS in order to excite and read out the nuclear resonance. The measuring accuracy of such probes is only physically limited by the signal-to-noise ratio (SNR) and the line width of the nuclear resonance sample (e.g., reciprocal value of the relaxation time T2 or T2*). Under favorable conditions, a relative uncertainty in measurement may be reached in the order of magnitude of 10^-8 for instance. With field probes of this type, the problem may exist that the magnetic field to be measured may also already be negatively affected by small susceptibilities of materials in the vicinity of the measuring volume. Causes may in particular be the liquid (e.g., in the field probe) itself (water is diamagnetic with μr~0.99999) or the vessel (tube), which contains this (e.g., made of glass). The conductor material (e.g., copper) of the (HF) coils may also present a problem, insofar as these are wound as closely as possible around the sample (=liquid) in order to achieve a good SNR.

An alloy made of a diamagnetic and a paramagnetic metal may be used for the coil wire so that the resulting susceptibility is adjusted to air (μr~1.0). This method may not be easily transferable to glasses or the signal-generating material of the sample in the field probe itself.

A spherical or ellipsoid-shaped body KP introduced into a homogeneous outer field also may have a homogeneous field in its interior. This is also then the case if the ellipsoid has different half axes and also if these are inclined at any angle toward the outer field. The sum of the inner field is only changed by a small, constant offset, which may be calculated with the aid of demagnetization factors or may be eliminated by a calibration.

A dissertation by C. Barmet, "Spatiotemporal Magnetic Field Monitoring for Magnetic Resonance Systems," 2008, Diss. ETH no. 17910 describes how the inhomogeneity caused by the susceptibility of the copper wire windings may be eliminated by casting into an artificial resin ellipsoid, the susceptibility of which is adjusted to that of the copper.

A long cylinder (e.g., as a limiting case of an ellipsoid) also has a homogeneous magnetic field in its interior. A long tube may therefore be filled with water and a similarly long wire coil may be wound around the same. A sample of this type in a field probe may have a large extent in the longitudinal direction, such that a measurement of non-homogeneous outer fields may be difficult.

A measuring volume MVOL may be delimited in the longitudinal direction by a short, signal-generating bolus (e.g., as a sample) being enclosed between two plugs made of a non-signal-generating material. An attempt to adjust the susceptibility of the plugs to water together with other requirements (not signal-generating, may be introduced into the tube, permanently stable against diffusion) may possibly be difficult to fulfill. The achievable SNR may also be reduced if the coil HFS has to be made much longer than the measuring volume.

Figure 2:
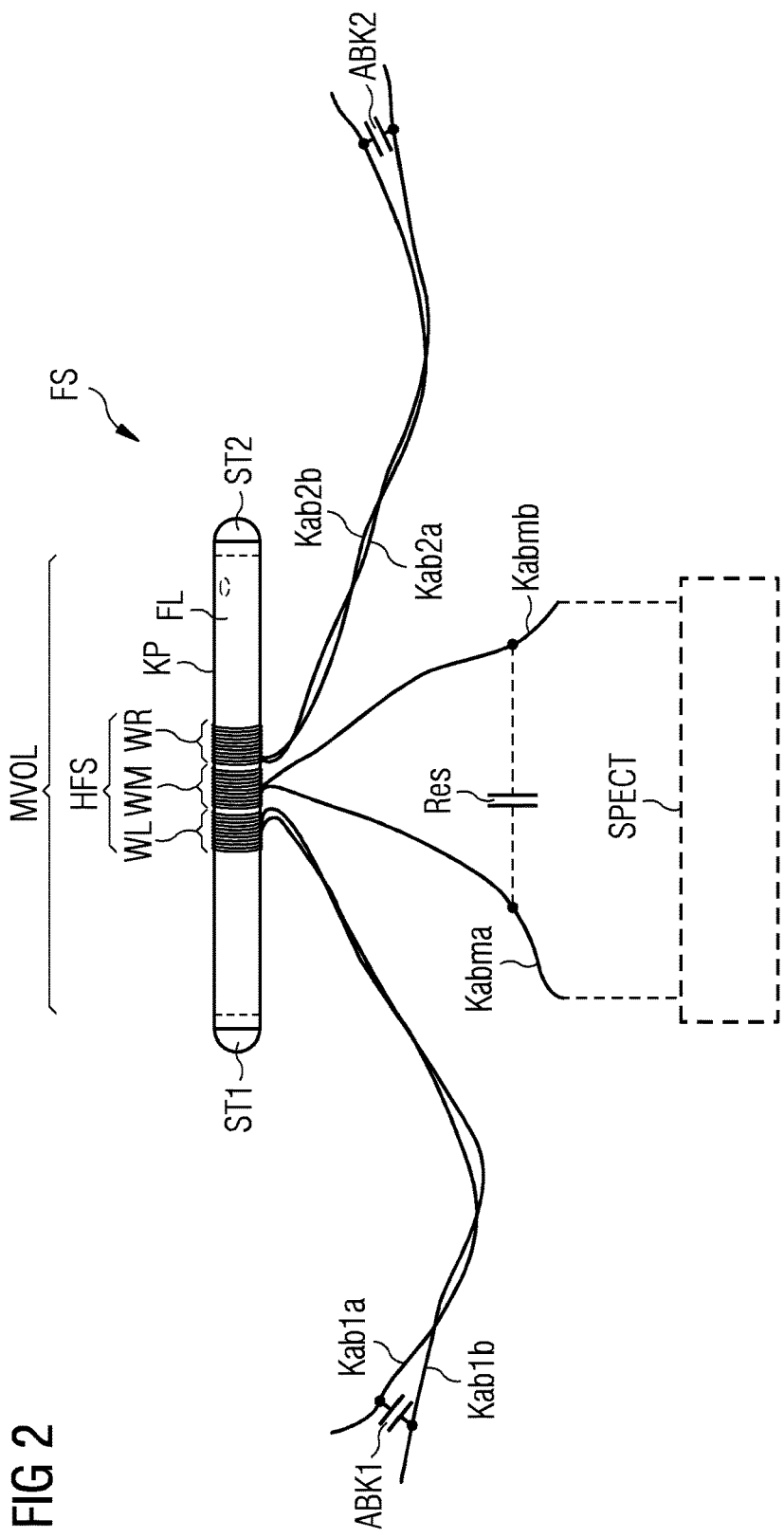
FIG. 2 depicts an example of a field probe with two outer winding sections to the sides in each case of an inner (e.g., middle or center) winding section.

According to an embodiment of a field probe FS depicted in FIG. 2, it is proposed to divide a long solenoid-type coil (e.g., a HF coil) HFS into, e.g., at least three (here axially offset with respective to each other, e.g., non-overlapping) winding sections WL, WM, WR. A signal is only generated, in this case, by a short active area (WM) in the middle or center, which is connected to a resonance capacitor (with, e.g., 50 pF) and a spectrometer SPECT (e.g., to analyze a $B_0$- and/or $B_1$ and/or $B_G$ magnetic field) (indicated simplified in FIGS. 2 and 3). The two outer parts (e.g., winding sections WL, WR, in other words windings in the outer part of the coil) continue the inner part (e.g., winding section WM, in other words windings in the inner part of the coil) approximately seamlessly here, so that if applicable a gap (between an outer winding section WL, WR and the middle or center winding section WM) may only have a negligible influence on the basic field ($B_0$).

It is also conceivable in principle for only one of the two outer winding sections WL, WR to be provided on the coil HFS.

For the radio frequency or the measurement of a radio frequency field (such as $B_1$ and/or $B_G$), the outer winding sections (winding parts) WL, WR of the coil HFS may be short-circuited so that the HF magnetic field may be considered approximately to have been pushed out from there. As a result, the sensitive area of the active area (in other words WM) of the coil HFS may be spatially localized in a relatively exact fashion. A large part of the length of the tube KP (e.g., approximately the length of MVOL) may be filled with water, etc., so that the ends of the liquid column (e.g., water column) and thus if necessary the sealing plugs ST1, ST2 may be relatively distant from the measured area (in other words, e.g., the area within WM) of the measuring volume (e.g., in the body KP).

With a measurement of time-varying fields (such as $B_1$ and/or $B_G$), the problem may exist that currents, which may corrupt the field to be measured (e.g., $B_1$ and/or $B_G$), may be induced in the short-circuited outer winding parts WL, WR. This may be avoided if a HF short circuit (depicted in FIG. 2 at the free end of the wires Kab1a/Kab1b or between Kab2a, Kab2b) is established by way of/through (in each case) a blocking capacitor ABK1, ABK2 (e.g., 5 nF).

FIG. 2 depicts a field probe FS with (e.g., as additional windings) two outer winding sections (left:) WL, (right:) WR to the sides of an inner (e.g., middle/center) winding section WM and with a body KP in the form of a tube with an elongated liquid column MVOL made of signal-generating material (e.g., length >5 times diameter), in which (FS) the body KP of the field probe FS is wrapped with a three-part cylinder coil. The middle or center part (winding section WM) is relatively short (e.g., length approx. equal to the diameter) and may be or is connected here (e.g., via electrically conducting cables Kabma, Kabmb) to a spectrometer SPEKT, while the outer winding sections WL, WR are comparatively long (e.g., length >2 times diameter) and are short-circuited, e.g., by way of electrically conducting cables (Kb1a, Kb1b or Kb1a, Kb1b) by blocking capacitors ABK1, ABK2, wherein relatively seamless transitions (e.g., with a gap in each case of less than 0.2*diameter of the coil HFS) exist between the three partial windings WL, WM, WR.

The winding sections WL, WR are depicted here with a number of wire windings, but may theoretically possibly have fewer windings or only one (e.g., wide) winding.

One advantage of the embodiments described herein may be, e.g., that a new possibility for improving the $B_0$ field homogeneity within a $B_0$ field probe may be produced.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A field probe for measuring a magnetic field in an imaging magnetic resonance tomography system, the field probe comprising:
   a body; and
   a coil surrounding at least a portion of the body, the coil having a center winding section and two outer winding sections, each outer winding section being adjacent to the center winding section,
   wherein the two outer winding sections continue the center winding section such that a gap between the two outer winding sections has a negligible influence on a basic field of a magnetic resonance tomography device.

2. The field probe of claim 1, wherein the center winding section and the two outer winding sections each have a same diameter.

3. A field probe for measuring a magnetic field in an imaging magnetic resonance tomography system, the field probe comprising:
   a body; and
   a coil surrounding at least a portion of the body, the coil having a center winding section and two outer winding sections, each outer winding section being adjacent to the center winding section,
   wherein the two outer winding sections are provided with a HF short circuit by way of a capacitor for and/or during a measurement of time-varying fields.

4. The field probe of claim 3, wherein the center winding section is isolated from the two outer winding sections.

5. The field probe of claim 1, wherein the two outer winding sections are each elongated, wherein each outer winding section has a length of at least two times of a diameter of the respective outer winding section.

6. A field probe for measuring a magnetic field in an imaging magnetic resonance tomography system, the field probe comprising:
   a body; and
   a coil surrounding at least a portion of the body, the coil having a center winding section and an outer winding section,
   wherein the center winding section and the outer winding section have separate coil connections.

7. The field probe of claim 1, wherein the body is filled with a liquid, which is surrounded by the coil by which a nuclear resonance is configured to be excited, read out, or excited and read out in the liquid.

8. The field probe of claim 7, wherein the liquid is water or benzene.

9. The field probe of claim 1, wherein only the center winding section is provided or connected for signal generation purposes.

10. The field probe of claim 1, wherein the center winding section of the coil is connected to or is configured to be connected to a spectrometer.

11. The field probe of claim 1, wherein the center winding section of the coil is configured to be switched or connected to a resonance capacitor.

12. The field probe of claim 6, wherein the outer winding section is configured to be short-circuited for the measurement of a radio-frequency field.

13. The field probe of claim 1, wherein at least 80% of a length of a tube in the field probe is configured to be filled with a liquid such that ends of a liquid column of the liquid and sealing plugs are distanced from a measured volume of the liquid.

14. The field probe of claim 1, wherein the field probe comprises a tube having an elongated liquid column.

15. The field probe of claim 14, wherein the elongated liquid column has a length of more than five times a diameter of the tube.

16. The field probe of claim 1, wherein the center winding section has a length of less than two times a diameter of the center winding section.

17. The field probe of claim 1, wherein the center winding section and the two outer winding sections each has a diameter, and
a gap of less than 20% of the respective diameters exists between the center winding section and each outer winding section of the two outer winding sections.

18. The field probe of claim 1, wherein a nuclear resonance is configured to be excited, read out, or excited and read out with the coil.

19. The field probe of claim 1, wherein the coil comprises an electrical conductor having a conductor material made of copper.

20. The field probe of claim 1, wherein the body, the coil, or the body and the coil are each cylindrical.

21. The field probe of claim 1, wherein the center winding section and the two outer winding sections surround the same axis.

22. The field probe of claim 1, wherein the body is filled with a liquid, which, in a longitudinal direction, is delimited by two plugs made of a non-signal-generating material.

23. The field probe of claim 1, wherein the center winding section does not overlap with each outer winding section of the two outer winding sections.

24. The field probe of claim 1, wherein the coil is a radio-frequency coil.

25. A method for measuring a field in a magnetic resonance tomography system, the method comprising:
providing a field probe having a body and a coil surrounding at least a portion of the body, the coil having a center winding section and at least one outer winding section; and
generating a signal by a short active area in the center winding section, which is connected to a resonance capacitor and a spectrometer;
continuing the signal in the at least one outer winding section;
short-circuiting the at least one outer winding section such that a field is considered to have been pushed out from the at least one outer winding section; and
measuring the field.

26. A magnetic resonance tomography system comprising:
at least one field probe comprising:
a body; and
a coil surrounding at least a portion of the body, the coil having a center winding section and two outer winding sections, each outer winding section being adjacent to the center winding section,
wherein the center winding section is isolated from the two outer winding sections.

* * * * *